(12) United States Patent
Roychoudhuri et al.

(10) Patent No.: US 6,438,147 B1
(45) Date of Patent: Aug. 20, 2002

(54) TUNABLE EXTERNAL CAVITY DIODE LASER

(75) Inventors: Chandra Roychoudhuri, Storrs; David H. Tracy, Norwalk, both of CT (US); William J. Hubbard, Foster, RI (US)

(73) Assignee: Perkin Elmer Instruments LLC

( * ) Notice: Subject to any disclaimer, the term of this patent is extended or adjusted under 35 U.S.C. 154(b) by 0 days.

(21) Appl. No.: 09/230,499

(22) PCT Filed: Jul. 28, 1997

(86) PCT No.: PCT/US97/13152

§ 371 (c)(1),
(2), (4) Date: Jan. 26, 1999

(87) PCT Pub. No.: WO98/05105

PCT Pub. Date: Feb. 5, 1998

Related U.S. Application Data

(60) Provisional application No. 60/022,819, filed on Jul. 26, 1996.

(51) Int. Cl.[7] .................................................. H01S 3/13
(52) U.S. Cl. .............................. 372/20; 372/32; 372/34; 372/38.07; 372/43

(58) Field of Search .............................. 372/20, 32, 34, 372/36, 38.07, 43

(56) References Cited

U.S. PATENT DOCUMENTS

| | | | | |
|---|---|---|---|---|
| 4,796,996 A | * | 1/1989 | Burns | 356/372 |
| 5,444,724 A | * | 8/1995 | Goto | 372/20 |
| 5,771,252 A | * | 6/1998 | Lang | 372/20 |
| 5,812,572 A | * | 9/1998 | King | 372/38 |
| 5,936,987 A | * | 8/1999 | Ohishi | 372/29.014 |
| 6,081,539 A | * | 6/2000 | Mattori | 372/20 |

* cited by examiner

Primary Examiner—Paul Ip
Assistant Examiner—Gioacchino Inzirillo
(74) Attorney, Agent, or Firm—St. Onge Steward Johnston & Reens LLC

(57) ABSTRACT

An external cavity laser system composed of a semiconductor diode laser (10), a temperature control (30) and injection current control (40) means the diode laser, an external cavity (60) with a wavelength selector and means for controlling the laser temperature (20), laser injection current and the wavelength selector (110) to obtain arbitrary frequencies within the tuning range of the laser.

30 Claims, 2 Drawing Sheets

US 6,438,147 B1

TUNABLE EXTERNAL CAVITY DIODE LASER

This application claims priority from U.S. provisional application No. 60/022,819 filed on Jul. 26, 1996 incorporated herein by reference.

FIELD OF THE INVENTION

This invention related to lasers. More particularly it relates to tunable, external cavity lasers and laser systems.

BACKGROUND OF THE INVENTION

An external cavity laser or ECL, is a generic term for a configuration where the optical feedback path extends beyond the facets or boundaries of an optical gain medium. It consists of an optical gain medium (a semiconductor diode laser), optics for coupling the output of the diode laser into the external cavity, one or more wavelength selective filters, and one or more mirrors for defining an external feedback path, possibly with a piezoelectric translator for fine tuning. The external cavity may also contain additional components such as polarization optics, beamsplitters, prisms, telescopes, etc.

The purpose of the external cavity is to provide optical feedback to the laser to control its output characteristics. Some of the characteristics associated with an ECL are a reduction in threshold lasing current and line width, and longitudinal mode selection, and control of the lasing frequency. Solitary diode lasers, or diode lasers with no external reflectors, usually lase at the modes that are at their center of their gain curves. Only a relatively small amount of tuning may be achieved by varying temperature and injection current of the solitary lasers. They also lase at higher threshold currents than do ECLs, which is due to their relatively lower lasing efficiency resulting from the absence of an additional reflector provided by an external cavity. The lower lasing efficiency is evident in the comparison of the greater threshold injection currents required to cause lasing in the solitary lasers.

Present uses of ECLs include spectroscopy and fiber optic test equipment. ECLs are particularly well suited for high-resolution atomic spectroscopy, possessing output wavelengths which match many transitions of various atomic elements including sodium, rubidium, and uranium.

Widespread use of broadly tunable laser diodes in low to moderate resolution spectroscopy applications requires fast, simple, and highly reliable tuning to arbitrary specified frequencies on demand. This may take the form of smooth, quasi-continuous tuning in wavelength, but for many applications step tuning is adequate. The well known problem is that laser diode chip modes, which have about a 1 cm-1 (30 GHz) mode spacing (Free spectral range) interfere with smooth tuning by an external cavity. Unless superb anti-reflection coatings are used on the output facet of the diode, it is difficult or impossible to tune the laser in between the longitudinal chip modes using the external cavity tuning element, which is typically a diffraction grating. Additional problems arise, at higher resolution, from discrete longitudinal external cavity modes, which may have ~0.05 cm-1 spacing.

Achieving a specified operation frequency involves tuning both the diode chip and the external cavity. The former may be accomplished by varying the chip temperature T (which can easily tune over several modes), the injection current i, or (less commonly) the mechanical stress applied to the device. Tuning the external cavity involves adjusting the grating angle and/or cavity length. For cavity designs using Fabry-Perot etalons as tuning elements, the etalon must also be tuned via gap size or tilt angle.

Expert users commonly use these adjustments to achieve satisfactory laser tunes, with the help of diagnostic instruments and operator skill. Once set, short range tuning can be accomplished by several means. Very short tuning ranges can be accessed by varying the external cavity length via piezo devices or otherwise. Somewhat longer scans, of up to a half a chip mode or so, can be attained via variation of injection current. However, if this current tuning is not coordinated with the external cavity length, the tune will consist of a series of external cavity mode hops.

SUMMARY OF THE INVENTION

It is an object of the invention to perform an automated calibration procedure to characterize a standard, off-the-shelf diode laser in an ECL configuration and construct a wavelength tuning model. It is a further object of the invention to utilize the wavelength tuning model in normal operation to automate the ability to tune the system to any desired wavelength within the specification of the diode laser.

The apparatus of the invention includes an external cavity laser system with a semiconductor diode laser, a temperature controller for the diode laser, a control for the laser injection current and a means for wavelength selection in the external cavity. The length of the external cavity may also be controlled.

In order to automate system tuning in normal operation, a wavelength tuning model is developed. In order to develop the tuning model, the diode laser system, including the external cavity components, are characterized by measuring the system output over a desired range of operating parameters. This is accomplished by identifying the range of each operating characteristic: laser temperature, injection current and external cavity wavelength and using these ranges in a calibration procedure by incrementally stepping the system through each possible combination of values. At each step, the values are recorded along with the corresponding system output. The data is then assembled into a table of operating characteristics. The length of the cavity may also be incremented and the system output recorded as an additional set of data in the table.

The table of operating characteristics is then analyzed to obtain values of operating characteristics that result in the diode laser operating at a specific solitary longitudinal mode and frequency. These selected values are then used to operate the system in an autotuning fashion where a desired solitary longitudinal mode and frequency is achieved by setting the system to a selected discrete set of values in the table. The table is updated or refined as needed, for instance to compensate for system drift, by reacquiring all, or some, of the operating characteristics and reanalyzing the data. The selected values are also utilized to cause the system to scan a range of frequencies.

At any time during the operation but particularly during calibration, the system output can be measured using a wavemeter, a plane Fabry-Perot etalon, a spherical Fabry-Perot etalon, a grating polychromator, an acousto-optical tunable filter, a spectrum analyzer or a Lyot-filter spectrometer. The important output characteristics are optical power output and frequency.

DETAILED DESCRIPTION OF THE INVENTION

Figure 1:
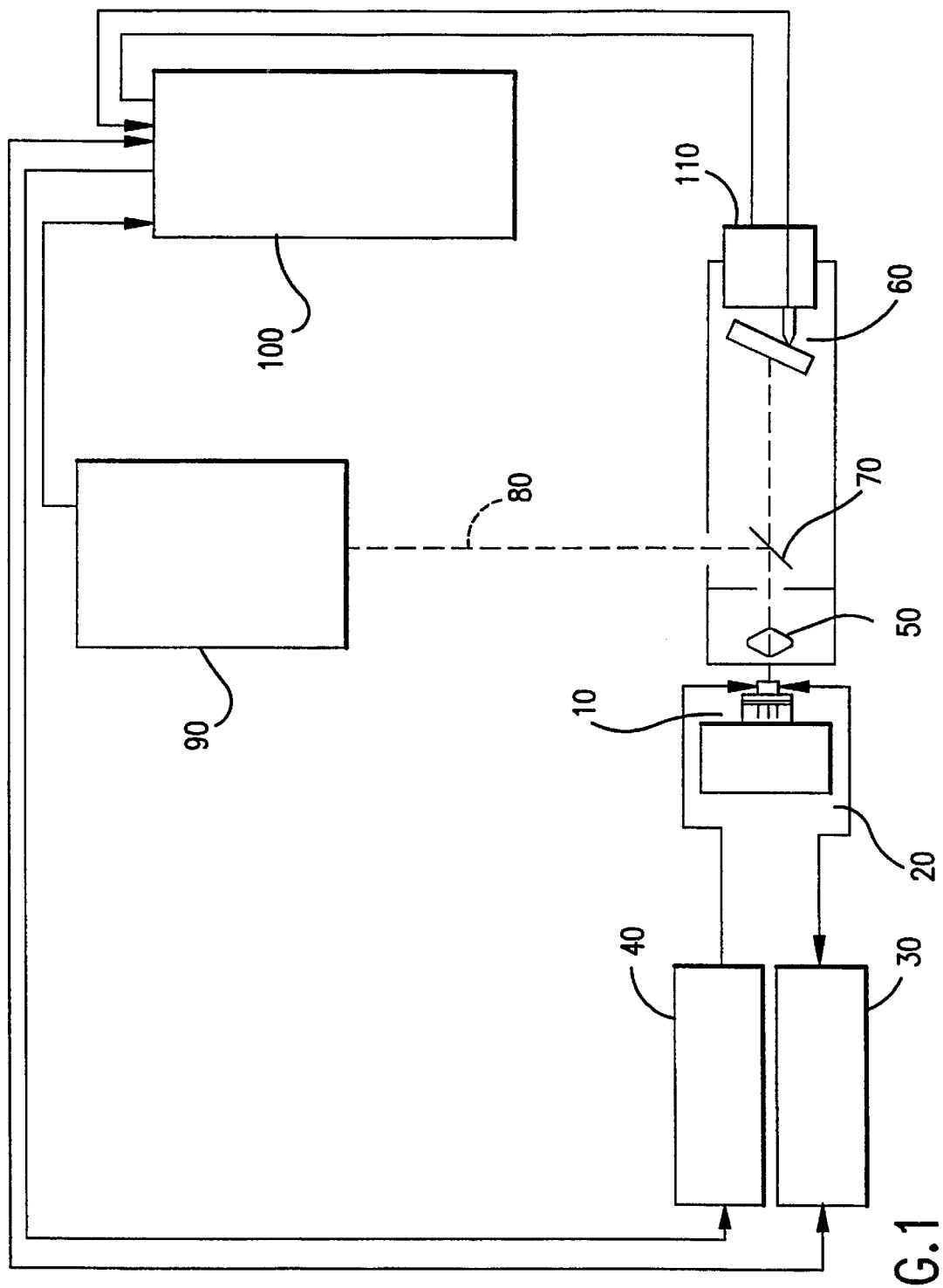
FIG. 1 is a schematic diagram of the external cavity laser system in accordance with the invention.

A schematic diagram of the external cavity laser system is shown in FIG. 1.

The diode laser 10 is mounted on a heatsink 20 whose temperature is controlled by a temperature control means 30. The diode laser injection current is controlled by the current control means 40. A collimating lens 50 transforms the Gaussian beam waist inside the laser to a larger beam waist incident on a diffraction grating 60. Lens 50 has anti-reflective coating to reduce any unwanted reflections which will affect the laser output. An intra-cavity beamsplitter 70 provides a spatially constant output beam 80. The diffraction grating 60 provides the optical filtering necessary for longitudinal chip mode selection. The filtering overcomes the laser's tendency to lase at the peak of its gain curve by increasing the loss of the cavity at frequencies away from the feedback frequency of the grating. A means for measuring the system output 90 as well as a means for controlling the system such as a digital computer 100 is provided. A means for varying the length of the external cavity 110 is also provided.

Construction of the tuning model is separated into two parts, a model for the laser diode chip itself and a model for the external cavity. When both components have been tuned to the desired frequency together the system will lase reliably at the desired wavelength. A fully detailed analysis by P. Zorabedian, "Axial-mode instability in tunable external-cavity semiconductor lasers", *IEEE J. Quanitum Electron.* QE-30, p. 1542 (1994) takes into account both coupled cavity effects and non-linearity introduced by the dependence of the real and imaginary parts of the diode chip refractive index upon the optical field amplitude in the chip, which in turn depends upon the tune condition. These effects give rise to an optimal system tune in which the external cavity is slightly detuned from the nominal desired output frequency. Also, the system output frequency, for small EC tuning deviations about this optimum, tends to be "pulled" toward this optimum by the influence of the chip mode. For sufficiently large EC detuning, the system output becomes unstable in both frequency and amplitude, eventually hopping to the adjacent chip mode.

In the following discussion, the dependence of the effective refractive index of the gain medium upon the optical field amplitude is suppressed, and the external cavity tuning offsets are considered to be absorbed into the external cavity calibration parameters. The resulting tuning model therefore incorporates these effects implicitly.

Laser Tuning Model

The diode will lase at one of its natural longitudinal modes, given by $$m = 2n(\sigma,T,i)l(T)\sigma_m \quad (1)$$

where m is an integer mode number, n is the effective refractive index of the lasing medium, including both material index effects and waveguiding dispersion, l is the chip length, $\sigma_m \equiv 1/\lambda_m$ is the lasing wavenumber in mode m, T is the chip temperature, and i is the injection current. Facet coating phase shifts are not explicitly included in (1), but are effectively absorbed into the effective index n.

The product of n and l, otherwise known as the optical path length, is determined from:

$$p \equiv nl = n(\sigma,T,i)l(T) \quad (2)$$

The wavenumber dispersion factor is removed:

$$p(\sigma,T,i) = p_0(T,i)\delta(\sigma) \quad (3)$$

where the dispersion factor $\delta(\sigma)$, nominally unity, is given by $$\delta(\sigma) = \{n(\sigma,T_0,i_0)/n(\sigma_0,T_0,i_0)\} \quad (4)$$

and

σ0=nominal midrange value of wavenumber =$1/\lambda 0$

T0=nominal midrange temperature reference value i0=nominal current.

Equation (1) is now written as $$m = 2p\sigma m = 2p0(T,i)\delta(\sigma)\sigma m \quad (5)$$

or $$m = 2p/\lambda m \quad (5a)$$

The optical path length $p_0$ for a given diode is estimated from the observed modal wavenumbers, subject to the dispersion function. The dispersion is estimated from (4), using the known index dispersion of the diode material or a low order polynomial dispersion is selected that will fit (5).

$$\delta(\sigma) = 1 + c_2(\sigma-\sigma_0)^2 + \ldots \quad (6)$$

Figure 2:
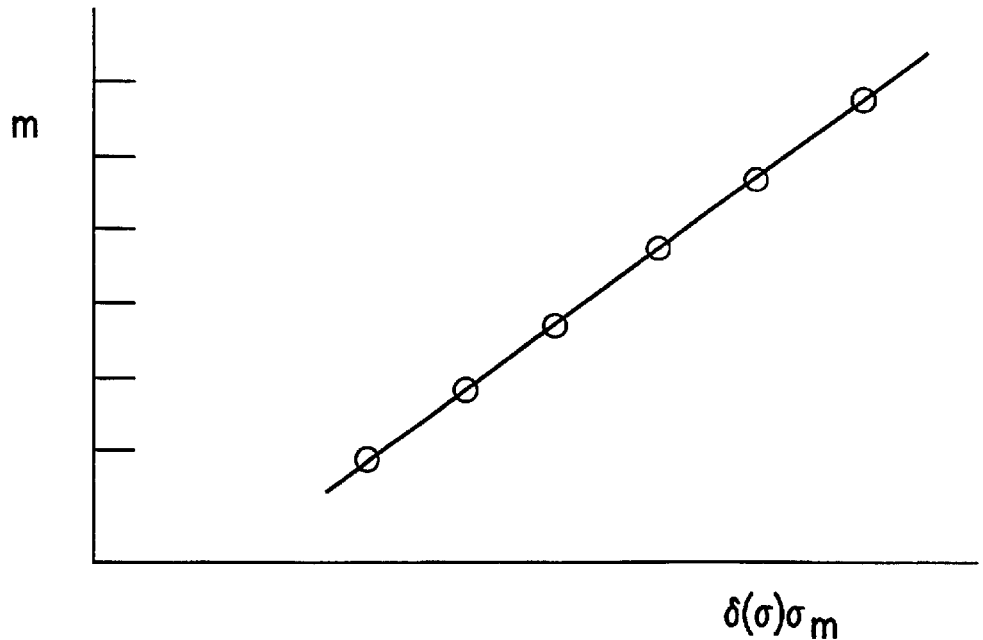
FIG. 2 is a plot of mode numbers vs dispersion factors.

$c_2$ and $p_0$ are determined empirically by gathering data identifying the modal frequencies for as broad a range of consecutive modes as possible across the tuning range. An arbitrary m value $m^1$ is assigned to the first mode and consecutive m values $m^1+1$, $m^1+2$, etc. to succeeding modes. A plot of m vs $\delta(\sigma)\sigma_m$, is then produced as shown in FIG. 2. Where the result is not a straight line, $c_2$ or higher order polynomial terms are adjusted to correct the linearity.

The slope of the m vs $\delta(\sigma)\sigma_m$ line gives an estimate for $p_0$ and the intercept on the m axis at $[\delta(\sigma)\sigma]=0$ gives an estimate for m', allowing the assignment of absolute mode numbers m. With the mode numbers given absolute values, the linear regression line can be forced through the origin, the slope redetermined and the new slope value used for $p_0(T,i)$. A fit to the mode data gives both absolute mode indices and a good estimate of the effective optical path length of the diode for the particular T and i used.

The accuracy with which the slope and intercept can be determined is limited, especially for a diode with a short tuning range for which only a few dozen modes can be measured. Finding the zero wavenumber intercept amounts to a huge extrapolation, and the dispersion function will not be accurately known. As a result, the absolute mode order numbers assigned are likely to be in error by a few units or even tens of units. This probable error in m has little or no consequence, however, since the optical path length which is simultaneously determined is in error also, in just such a way as to yield a correct description of the device behavior over the actual tuning range.

The model for the optical path is equation (3) with the following:

$$p_0(T,i) = p_0(T_0,i_0)\{1 + \alpha(T-T_0) + \beta(i-i_0)\} \quad (7)$$

Assuming that higher order terms or additional cross terms in T or i and wavenumber offset $\sigma-\sigma_0$ are immaterial, the expanded version of equation (3) is:

$$p(\sigma,T,i)=\delta(\sigma)p_0(T_0,i_0)\{1+\alpha(T-T_0)+\beta(i-i_0)\}=p_0(T_0,i_0)\{1+c_2(\sigma-\sigma_2)^2\}\{1+\alpha(T-T_0)+\beta(i-i_0)\} \quad (8)$$

Fully characterizing the diode now requires determination of only four parameters: $p_0(T_0,i_0)$, $c_2$, $\alpha$, and $\beta$. Of these, only $p_0$ must be measured accurately, and will be subject to significant drift or aging.

Assuming that $c_2$, $\alpha$, and $\beta$ are insignificant, the first order cross terms $c_2\alpha$ and $c_2\beta$ are negligible, so that the wavenumber dependence, the temperature dependence, and the current dependence are separable, resulting in this simple overall form for the optical path length of the laser diode chip:

$$p(\sigma,T,i)=p_0(T_0,i_0)\{1+c_2(\sigma-\sigma_0)^2+\alpha(T-T_0)+\beta(i-i_0)\} \quad (9)$$

Figure 3:
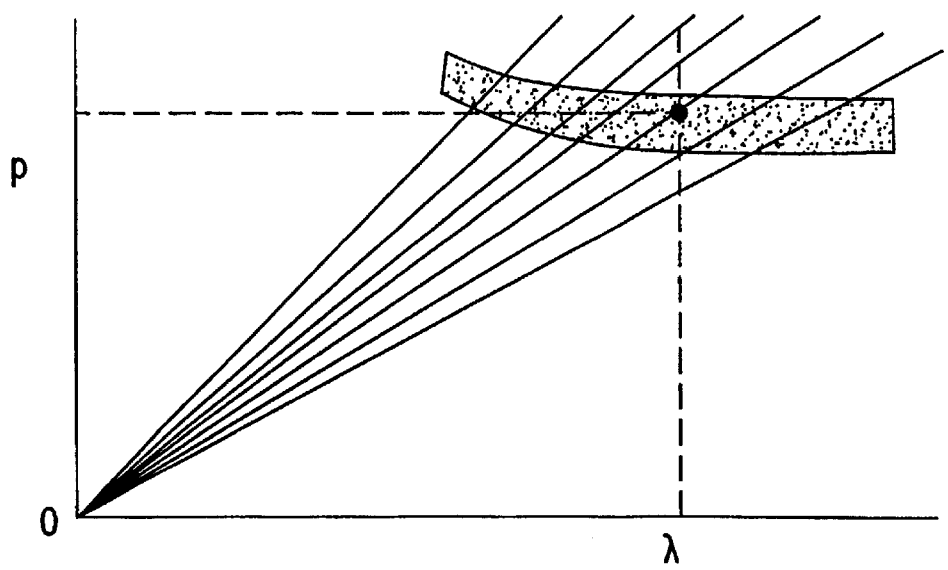
FIG. 3 is a plot of diode chip optical path length vs wavelength, showing longitudinal modes.

When (9) is combined with the mode number expression (5), we have a composite picture of the laser diode operation, as shown in FIG. 3. The outlined region represents the attainable optical path zone, which can be accessed via control of chip temperature and current (equation 9). The diagonal lines represent individual longitudinal chip modes, as given by equation (5). Any point along one of the mode solutions which is inside the outlined region is accessible, provided that there exists sufficient gain at the corresponding wavelength.

The tuning parameters of the external cavity are dependent on its optical design. This embodiment utilizes a Littrow grating design, where the grating angle is established via stepper motor control. The grating tune angle may be affected by environmental temperature but can be compensated by the following equation:

$$\theta=\theta(\lambda,T)=\theta(\lambda,T_0)+(d\theta/dT)(T-T) \quad (10)$$

Where $\theta$ is the grating angle.

The functional relationship is determined experimentally and is expressed as a table or a polynomial fit. The assumption is that the diode temperature effect is small and can be represented adequately by a linear correction in $\theta$ which is wavelength independent.

The models are now used to characterize the system. The following parameters are determined:

1. The nominal parameter values $T_0,i_0,\sigma_0=1/\lambda_0$.
2. The allowed tuning range $(\lambda_{max},\lambda_{max})$.
3. The allowed discrete set of operating temperatures $(T_1=T_{min},T_2,\ldots T_{max})$.
4. The optimum temperature function $T_{opt}(\lambda)$, which in turn requires gain or output power measurements.
5. The limiting allowed injection current values $i_{min}(\lambda)$ and $i_{max}(\lambda)$.
6. The scalar chip parameters $p_0(T_0, i_0)$, $c_2,\alpha$, and $\beta$ defined above.
7. The external cavity tune function $\theta(\lambda, T_0)$, which may be a table or analytic relationship, and its temperature coefficient $(d\theta/dT)$, a system constant.

Items 1–3 are determined from the diode laser specifications, items 4–5 are determined either manually or automatically and items 6–7 are computed automatically or semi-automatically from experimental data.

The data to establish the above items is obtained from one large experimental run. The laser system as described above includes a means for measuring the system output 90 (FIG. 1) such as a wavemeter, a plane Fabry-Perot etalon, a spherical Fabry-Perot etalon, a grating polychromator, an acousto-optical tunable filter, a spectrum analyzer or a Lyot-filter spectrometer. The important output characteristics are optical power output and frequency. The data set consists of a number of grating scans obtained for various fixed values of T and i. These will normally be (T, i, θ) sets. For each point the optical power output and frequency are recorded.

Most of the raw data obtained corresponds to out-of-tune conditions. Only those points for which both the chip and the external cavity are simultaneously in tune are subsequently utilized. The raw data contains the expected chip mode hops, with regions of smooth tuning, dominated by chip pulling. The mode hop points can be determined by existence of frequency anomalies due to multi-moding, discontinuities in the wavelength $\lambda_{WM}$, or anomalies in the system power output. Identification of the mode hops is facilitated by the specification of the chip mode free spectral range because the mode hops occur at highly regular intervals. When required, information from multiple grating scans, corresponding to various T and i, is combined to provide a more coherent picture of the mode structure. The ideal operating points are located closest to the midpoint between mode hops.

Iterations of the raw data acquisition improves automatic and accurate selection of the ideal operating points. On subsequent passes there already exist approximations of the chip parameters and of the overall mode structure in wavelength, T, and i. This permits a global fit to the data set, using some measures of mode hopping, that are highly immune to local noise.

The reduced data set of ideal operating points is stored in a smaller data structure, which need no longer be ordered in any particular way and is no longer associated with particular grating scans. The data is structured to allow introduction of additional data points such as variations in external cavity length or introduction of mode index numbers.

The next step is to identify those ideal operating points in the data structure having the same mode number, and assign consecutive working values to adjacent modes. Upon completion, all modes have assigned m values, but all will contain an arbitrary common offset. Consecutive ideal operating points obtained from any one grating scan (increasing $\lambda$) correspond to consecutive decreasing m values. The mode number offsets are then correlated between scans. Alternatively equation (5), together with equations (8) or (9), and initial estimates of p0, c2, $\alpha$, and $\beta$, are used to compute an estimated mode number M (a real number, not an integer) for each ideal operating point. These contain an offset, but are grouped together. Thus, even though the values realized are fractional and contain large offsets, the ideal operating points form readily identifiable groups and the relative order (sequence) of the associated mode numbers is evident.

At this point, arbitrary temporary integer m values are assigned to each point. The actual m values are given by:

$$m_j=m_{j,TEMP}+\Delta m \quad (12)$$

where the common offset $\Delta m$ is an integer to be determined. It may be positive or negative.

The entire data set is used simultaneously to refine all the parameters by first computing the least squares regression estimates for $P_0$, $\alpha$, and $\beta$ using a linear model derived from equations (5) and (9), for which, for the $j^{th}$ ideal operating point, the estimated wavelength is:

$$\lambda_j^{EST}=(2/m_j)p(\lambda_j^{WM},T_j, i_j)=p_0(T_0,i_0)\{1+c_2(1/\lambda_j^{WM}-\sigma_0)^2+\alpha(T_j-T_0)+\beta(i_j-i_0)\} \quad (13)$$

These linear estimates for $\lambda_j$ are used to fit the observed values, namely $\lambda_j^{WM}$ The fitting coefficients are simply $C_0 = p_0$
$C_1 = p_0 \, c_2$
$C_2 = p_0 \, \alpha$
$C_3 = p_0 \, \beta$ Thus, given $C_0, \ldots C_3$ from the regression it is trivial to compute $p_0, c_2, \alpha$ and $\beta$.

The parameters are further refined by computing the residual variance:

$V_{\Delta m} = \Sigma(\lambda_j^{WM} - \lambda_j^{EST})^2$, assigning the value of $\Delta m$ for which $V_{\Delta m}$ is a minimum and adding the $m_{j,TEMP}$ values from equation (12) to provide definitive order numbers.

To determine the grating calibration table, a set of $(\theta, \lambda, T)$ triplets is extracted from the set of ideal operating points and used to express the grating motor step as a polynomial in wavelength, with a linear term in T as in equation 10:

$$\theta = \theta(\lambda, T) = \theta_0 + \theta_1(\lambda - \lambda_0) + \theta_2(\lambda - \lambda_0)^2 + \ldots + (d\theta/dT)(T - T_0) \quad (10a)$$

The coefficients $\theta_i$ and $(d\theta/dT)$ are determined in one global step by another least squares regression.

The open loop tune to an arbitrary specified wavelength $\lambda_{tune}$, is then executed by determining whether $\lambda_{tune}$ falls within the accessible tuning range $(\lambda_{min}, \lambda_{max})$, selecting the ideal mode number for $\lambda_{tune}$, finding $\lambda_{tune}$ and its ideal mode number in the table of ideal operating characteristics and setting the system using those ideal data points.

What is claimed is:

1. An external cavity laser system comprising:
   a semiconductor diode laser;
   temperature control means for controlling temperature of said laser;
   current control means for controlling injection current of the laser;
   an external cavity having wavelength selection means and cavity length selection means, positioned to provide feedback to said laser;
   said external cavity being coupled to said laser for measuring and transmitting an output of the system over a range of operating parameters;
   means for controlling said temperature control means, said current control means, said cavity length selection means, and said wavelength selection means to obtain arbitrary frequencies of operation of the laser system within the tuning range of said laser;
   said control means including varying means for varying selections made by said temperature control means, current control means, cavity length selection means and wavelength selection means in discrete increments; and,
   means for recording a set of discrete values corresponding to said increments and a corresponding system output of the laser system to form a table of operating characteristics.

2. The system of claim 1, further comprising means for analyzing said table of operating characteristics to obtain values for laser temperature, laser injection current, cavity length and wavelength selection means that result in said semiconductor diode laser operating at a specific solitary longitudinal mode and frequency.

3. The system of claim 1, wherein the corresponding system output is measured using at least one of the group consisting of a wavemeter, a plane Fabry-Perot etalon, a spherical Fabry-Perot etalon, a grating polychromator, an acousto-optical tunable filter, a spectrum analyzer and a Lyot-filter spectrometer.

4. The system of claim 1, wherein the corresponding system output measured is at least one of optical power output and frequency.

5. The system of claim 1, where said semiconductor diode laser is a Fabry-Perot laser in which the output facet anti-reflection coating is not optimized.

6. The system of claim 2, wherein said control means further comprises means for utilizing said analyzed table of operating characteristics to cause the external cavity laser system to operate at a selected solitary longitudinal mode and frequency by selecting said discrete values for laser temperature, laser injection current, cavity length and wavelength selection means.

7. The system of claim 2, further comprising means for reacquiring said table of operating characteristics or a subset of said table and analyzing said table or said subset at a later time to account for changes in said external cavity laser system characteristics.

8. The system of claim 2, wherein said control means further comprises means for utilizing said analyzed table of operating characteristics to cause the external cavity laser system to scan a range of frequencies.

9. In an external cavity laser system comprising a semiconductor diode laser, temperature control means for controlling temperature of said laser, current control means for controlling injection current of the laser and an external cavity having wavelength selection means and cavity length selection means, positioned to provide positive feedback to said laser;
   a method for characterizing said semiconductor laser diode comprising:
   controlling said laser temperature, said laser injection current, said cavity length selection means and wavelength selection means to obtain arbitrary frequencies of operation of the laser system within the tuning range of said laser;
   varying values for said temperature control means, current control means, cavity length selection means and wavelength selection means in discrete increments;
   recording a set of discrete values corresponding to said increments with a corresponding system output of the external cavity laser system to form a table of operating characteristics;
   coupling an external cavity to said laser;
   measuring an output of the system over a range of operating parameters; and
   transmitting the output to said laser.

10. The method of claim 9, where said semiconductor diode laser is a Fabry-Perot laser in which the output facet anti-reflection coating is not optimized.

11. The method of claim 9, further comprising analyzing said table of operating characteristics to obtain values for laser temperature, laser injection current, cavity length and wavelength selection means that result in said semiconductor diode laser operating at a specific solitary longitudinal mode and frequency.

12. The method of claim 9, wherein the corresponding system output is measured using at least one of the group consisting of a wavemeter, a plane Fabry-Perot etalon, a spherical Fabry-Perot etalon, a grating polychromator, an acousto-optical tunable filter, a spectrum analyzer and a Lyot-filter spectrometer.

13. The method of claim 9, wherein the corresponding system output measured is at least one of optical power output and frequency.

14. The method of claim 11, further comprising utilizing said analyzed table of operating characteristics to cause the external cavity laser system to operate at a selected solitary longitudinal mode and frequency by selecting said discrete values for laser temperature, laser injection current, cavity length and wavelength selection means.

15. The method of claim 11, further comprising reacquiring at least a subset of said table of operating characteristics and analyzing said at least a subset to account for changes in said external cavity laser system characteristics.

16. The method of claim 11, further comprising utilizing said analyzed table of operating characteristics to cause the external cavity laser system to scan a range of frequencies.

17. An external cavity laser system comprising:

a semiconductor diode laser;

temperature control means for controlling temperature of said laser;

current control means for controlling injection current of the laser;

an external cavity having wavelength selection means positioned to provide feedback to said laser;

means for controlling said temperature control means, said current control means, and said wavelength selection, means to obtain arbitrary frequencies of operation of the laser system within the tuning range of said laser;

said control means including varying means for varying selections made by said temperature control means, current control means, and wavelength selection means in discrete increments; and, means for recording a set of discrete values corresponding to said increments and a corresponding system output of the laser system to form a table of operating characteristics.

18. The system of claim 17 comprising means for analyzing said table of operating characteristics to obtain values for laser temperature, laser injection current and wavelength selection means that result in said semiconductor diode laser operating at a specific solitary longitudinal mode and frequency.

19. The system of claim 17, wherein the corresponding system output is measured using at least one of the group consisting of a wavemeter, a plane Fabry-Perot etalon, a spherical Fabry-Perot etalon, a grating polychromator, an acousto-optical tunable filter, a spectrum analyzer and a Lyot-filter spectrometer.

20. The system of claim 17, wherein the corresponding system output measured is at least one of optical power output and frequency.

21. The system of claim 18, wherein said control means further comprises means for utilizing said analyzed table of operating characteristics to cause the external cavity laser system to operate at a selected solitary longitudinal mode and frequency by selecting said discrete values for laser temperature, laser injection current and wavelength selected by said wavelength selection means.

22. The system of claim 18, further comprising means for reacquiring at least a subset of said table of operating characteristics and analyzing said table or said at least a subset to account for changes in said external cavity laser system characteristics.

23. The system of claim 18, wherein said control means further comprises means for utilizing said analyzed table of operating characteristics to cause the external cavity laser system to scan a range of frequencies.

24. In an external cavity laser system comprising a semiconductor diode laser, temperature control means for controlling temperature of said laser, current control means for controlling injection current of the laser and an external cavity having wavelength selection means positioned to provide positive feedback to said laser;

a method for characterizing said semiconductor laser diode comprising:

controlling said laser temperature, said laser injection current, and said wavelength selection means to obtain arbitrary frequencies of operation of the laser system within the tuning range of said laser;

varying values for said temperature control means, current control means, and said wavelength selection means in discrete increments; and, recording a set of discrete values corresponding to said increments with a corresponding system output of the external cavity laser system to form a table of operating characteristics.

25. The method of claim 24, further comprising analyzing said table of operating characteristics to obtain values for laser temperature, laser injection current and wavelength selection means that result in said semiconductor diode laser operating at a specific solitary longitudinal mode and frequency.

26. The method of claim 24, wherein the corresponding system output is measured using at least one of the group consisting of a wavemeter, a plane Fabry-Perot etalon, a spherical Fabry-Perot etalon, a grating polychromator, an acousto-optical tunable filter, a spectrum analyzer and a Lyot-filter spectrometer.

27. The method of claim 24, wherein the corresponding system output measure is at least one of optical power output and frequency.

28. The method of claim 25, further comprising utilizing said analyzed table of operating characteristics to cause the external cavity laser system to operate at a selected solitary longitudinal mode and frequency by selecting said discrete values for laser temperature, laser injection current and wavelength selected by said wavelength selection means.

29. The method of claim 25, further comprising reacquiring at least a subset of said table of operating characteristics and analyzing said at least a subset to account for changes in said external cavity laser system characteristics.

30. The method of claim 25, further comprising utilizing said analyzed table of operating characteristics to cause the external cavity laser system to scan a range of frequencies.

* * * * *